(12) United States Patent
Salle et al.

(10) Patent No.: US 7,183,848 B2
(45) Date of Patent: Feb. 27, 2007

(54) TRANSCONDUCTANCE AMPLIFIER

(75) Inventors: Didier Salle, Toulouse (FR); Ira Miller, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 10/973,728

(22) Filed: Oct. 26, 2004

(65) Prior Publication Data

US 2005/0088234 A1   Apr. 28, 2005

(30) Foreign Application Priority Data

Oct. 27, 2003   (EP) .................................. 03292679

(51) Int. Cl.
   *H03F 3/45* (2006.01)
(52) U.S. Cl. ..................... 330/254; 330/258; 330/260
(58) Field of Classification Search ................ 330/254, 330/258, 260
   See application file for complete search history.

(56) References Cited

U.S. PATENT DOCUMENTS

| 5,307,024 A | * | 4/1994 | Metz et al. .............. 330/259 |
| 2003/0052731 A1 | | 3/2003 | Kimura |

OTHER PUBLICATIONS

Ismail et al., "Novel CMOS Linearised Balanced Output Transconductance Amplifier Based on Differential Pairs," Frequenz Schiele und Schon GMBH, Berlin, DE, vol. 53, pp. 170-174, XP000920024.
Towers, "Balanced Transistor D.C. Amplifiers," Wireless World, IPC Business Press Ltd., Haywards Heath, GB, vol. 74, pp. 269-274, XP001127064.

* cited by examiner

*Primary Examiner*—Steven J. Mottola

(57) ABSTRACT

A transconductance amplifier comprising a first input circuit having a first feedback loop; a second input circuit having a second feedback loop; a resistor having a first interface connected to the first input circuit and a second interface connected to the second input circuit; a first differential pair having a first transistor arranged to control current flow in the first feedback loop to maintain a voltage at the first interface of the resistor at substantially a constant voltage relative to an input voltage applied to the first input circuit and a second transistor arranged to control current flow for a first output; and a second differential pair having a third transistor arranged to control current flow in the second feedback loop to maintain a voltage at the second interface of the resistor at substantially a constant voltage relative to an input voltage applied to the second input circuit and a fourth transistor arranged to control current flow for a second output.

5 Claims, 4 Drawing Sheets

TRANSCONDUCTANCE AMPLIFIER

FIELD OF THE INVENTION

The present invention relates to a transconductance amplifier.

BACKGROUND OF THE INVENTION

Transconductance amplifiers are used for converting an input voltage into an output current.

Many applications require a transconductance amplifier that has linear transfer characteristics and operates over a wide bandwidth.

One solution, shown in FIG. 1, shows a transconductance amplifier 100 having a first input circuit 101, a second input circuit 102, a first output circuit 103 and a second output circuit 104, with the first input circuit 101 and the second input circuit 102 being coupled via a resistor 105.

The first input circuit 101 has a first P-type FET 106 that has its source coupled to a first current source 107, which in turn is coupled to a supply line $V_{DD}$, and its drain coupled to a second current source 108, which in turn is coupled to a reference line GND, for example ground. The gate of the P-type FET 106 acts as the input $V_{in1}$ for the first input circuit 101. Additionally, the input circuit 101 includes a first N-type FET 109 in which the source is coupled to the reference line GND, the gate is coupled to a point between the first P-type FET drain and the second current source 108, and the drain is coupled to a point between the P-type FET source and the first current source 107 to form a feedback loop. The drain of the first N-type FET 109 is additionally coupled to a first interface of the resistor 105.

The second input circuit 102 is of similar design to the first input circuit 101 having a second P-type FET 110 that has its source coupled to a third current source 111, which in turn is coupled to the supply line $V_{DD}$, and its drain coupled to a fourth current source 112, which in turn is coupled to the reference line GND, for example ground. The gate of the P-type FET 110 acts as the input $V_{in2}$ for the second input circuit 102. Additionally, the second input circuit 102 includes a second N-type FET 113 in which the source is coupled to the reference line GND, the gate is coupled to a point between the second P-type FET drain and the fourth current source 112, and the drain is coupled to a point between the second P-type FET source and the third current source 111 to form a feedback loop. The drain of the second N-type FET 113 is additionally coupled to a second interface of the resistor 105.

The first output circuit 103 has a third N-type FET 114 that is arranged to form a current mirror with the feedback loop formed by the first N-type FET 109 where the third N-type FET 114 has its source coupled to the reference line GND, its drain couple to a fifth current source 115, which in turn is couple to the supply line $V_{DD}$, and its gate is coupled to a point between the drain of the first P-type FET 106 and the second current source 108. The output $I_{out1}$ for the first output circuit 103 is formed at a point between the drain of the third N-type FET 114 and the fifth current source 115.

The second output circuit 104 is of similar design to the first output circuit 103 having a fourth N-type FET 116 that is arranged to form a current mirror with the feedback loop formed by the second N-type FET 113 where the fourth N-type FET 116 has its source coupled to the reference line GND, its drain couple to a sixth current source 117, which in turn is couple to the supply line $V_{DD}$, and its gate is coupled to a point between the drain of the second P-type FET 110 and the fourth current source 112. The output $I_{out2}$ for the second output circuit 104 is formed at a point between the drain of the fourth N-type FET 116 and the sixth current source 117.

In order to obtain a linear voltage to current transfer function the voltage across the resistor 105 should be kept equal to the input voltage difference (i.e. $V_{in1}-V_{in2}$). This is achieved by keeping the drain-source current of the first P-type FET 106 and the second P-type FET 110 constant by means of the feedback loops formed by the first N-type FET 109 and the second N-type FET 113 respectively. The feedback loops compensates for current diverted from the first current source 107 and third current source 111 through the resistor 105, thereby ensuring that the drain-source current of the first P-type FET 106 and the second P-type FET 110 is maintained.

As the third N-type FET 114 and fourth N-type FET 116 form current mirrors with the feedback loops their drain-source current will be identical to that for the first N-type FET 109 and second N-type FET 113 respectively, which forms the transconductance amplifier output current $I_{out1}$, $I_{out2}$.

By way of illustration, when the input voltage difference is zero (i.e. $V_{in1}-V_{in2}=0$) no current will flow through the resistor 105 and consequently the current that flows through the first N-type FET 109 and the second N-type FET 113 is identical to the current flow in the output circuits and consequently there will be no output current.

When the input voltage difference is positive (i.e. $V_{in1}-V_{in2}>0$) a current (i.e. $V_{in1}-V_{in2}/R$) will flow into the resistor 105 and increase the current in the second N-type FET 113 by the same amount. This current is copied by the second N-type FET/fourth N-type FET current mirror arrangement into the fourth N-type FET 116 to provide an output current in the second output circuit 104 that is equal to $(V_{in1}V_{in2})/R$.

Correspondingly, when the output current in the second output circuit 104 is equal to $(V_{in1}-V_{in2})/R$ the current flowing into the first N-type FET 109 is reduced by $(V_{in1}-V_{in2})/R$ and this reduced current is copied into the third N-type FET 114 to provide an output current in the first output circuit 103 that is equal to $-(V_{in1}-V_{in2})/R$.

As the output current from the first output circuit 103 equals the negative of the second output circuit 104 the transconductance of the transconductance amplifier 100 is given by 1/R.

However, even though current mirrors are well suited for mirroring fixed currents they are not so suitable for mirroring variable currents. Consequently, the use of a current mirror to generate the transconductance amplifier's output current can limit the linearity of the voltage to current transfer function.

It is desirable to improve this situation.

STATEMENT OF THE INVENTION

In accordance with an aspect of the present invention there is provided a transconductance amplifier according to claim 1.

BRIEF DESCRIPTION OF THE DRAWINGS

An embodiment of the invention will now be described, by way of example, with reference to the drawings, of which.

DESCRIPTION OF THE PREFERRED EMBODIMENTS

Figure 2:
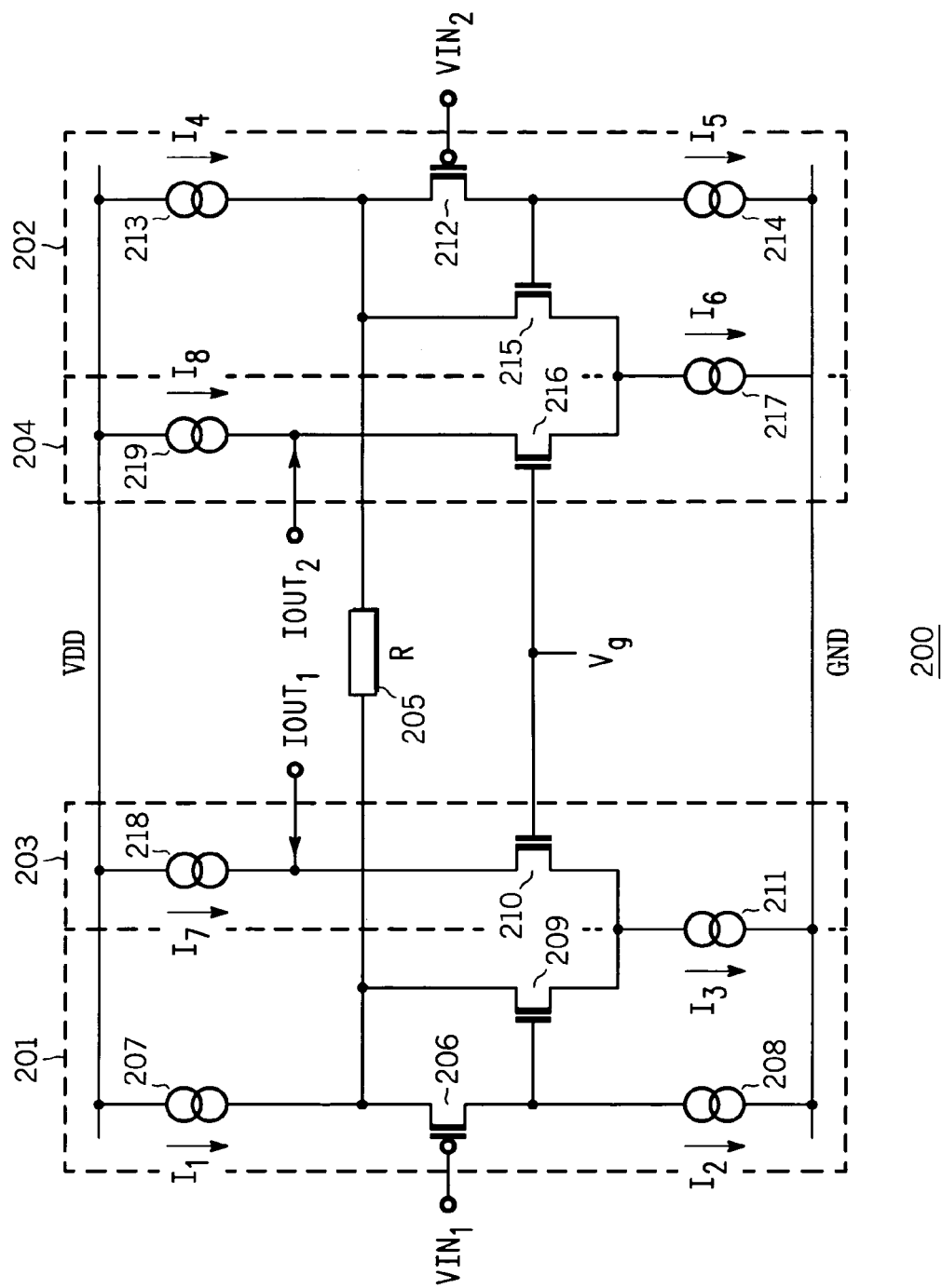
FIG. 2 illustrates a transconductance according to a first embodiment of the present invention.

FIG. 2 shows a first embodiment of a transconductance amplifier 200 having a fixed transconductance value.

The transconductance amplifier 200 includes a first input circuit 201, a second input circuit 202, a first output circuit 203 and a second output circuit 204, with the first input circuit 201 and the second input circuit 202 being coupled via a resistor 205.

The first input circuit 201 has a first P-type FET 206 that has its source coupled to a first current source 207, which in turn is coupled to a supply line $V_{DD}$, and its drain coupled to a second current source 208, which in turn is coupled to a reference line GND, for example ground. The gate of the P-type FET 206 acts as the input $V_{in1}$ for the first input circuit 201. Additionally, the input circuit 201 includes a first N-type FET 209 that forms a first differential pair with a second N-type FET 210. The source of the first N-type FET 209 is coupled to the source of the second N-type FET 210 and to a third current source 211, which in turn is coupled to the reference line GND. The gate of the first N-type FET 209 is coupled to a point between the first P-type FET drain and the second current source 208, and the drain is coupled to a point between the P-type FET source and the first current source 207 to form a feedback loop. The drain of the first N-type FET 209 is additionally coupled to a first interface of the resistor 205.

The second input circuit 202 is of similar design to the first input circuit 201 having a second P-type FET 212 that has its source coupled to a fourth current source 213, which in turn is coupled to the supply line $V_{DD}$, and its drain coupled to a fifth current source 214, which in turn is coupled to the reference line GND, for example ground. The gate of the P-type FET 212 acts as the input $V_{in2}$ for the second input circuit 202. Additionally, the second input circuit 202 includes a third N-type FET 215 that forms a second differential pair with a fourth N-type FET 216. The source of the third N-type FET 215 is coupled to the source of the fourth N-type FET 216 and to a sixth current source 217, which in turn is coupled to the reference line GND. The gate of the third N-type FET 215 is coupled to a point between the second P-type FET drain and the fifth current source 214, and the drain is coupled to a point between the second P-type FET source and the fourth current source 213 to form a feedback loop. The drain of the third N-type FET 215 is additionally coupled to a second interface of the resistor 205.

The first output circuit includes the second N-type FET 210 that forms a differential pair with the first N-type FET 209. As stated above, the second N-type FET 210 has its source coupled to the source of the first N-type FET 209 and to the third current source 211. The gate of the second N-type FET 210 is coupled to a biasing voltage $V_g$ where $V_g$ is selected to accommodate the desired input voltage and required gain. The drain of the second N-type FET 210 is coupled to a seventh current source 218, which in turn is coupled to the supply line $V_{DD}$. The output $I_{out1}$ for the first output circuit 203 is formed at a point between the drain of the second N-type FET 210 and the seventh current source 218.

The second output circuit 204 includes the fourth N-type FET 216 that forms a differential pair with the third N-type FET 215. As stated above, the fourth N-type FET 216 has its source coupled to the source of the third N-type FET 215 and to the sixth current source 217. The gate of the fourth N-type FET 216 is coupled to the biasing voltage $V_g$. The drain of the fourth N-type FET 216 is coupled to an eighth current source 219, which in turn is coupled to the supply line $V_{DD}$. The output for the second output circuit 209 is formed at a point between the drain of the fourth N-type FET 216 and the eighth current source 219.

As with the prior art solution, the voltage across the resistor 205 should be kept equal to the input voltage difference (i.e. $V_{in1}-V_{in2}$) to obtain a linear voltage to current transfer function. This is achieve by keeping the drain-source current of the first P-type FET 206 and the second P-type FET 212 constant by means of the feedback loops formed by the first N-type FET 209 and the third N-type FET 215 respectively. The feedback loops compensate for current diverted from the first current source 201 and fourth current source 213 through the resistor 205, thereby ensuring that the drain-source current of the first P-type FET 206 and the second P-type FET 212 is maintained.

However, rather than the output current mirroring the current flowing in the feedback loops, as with the prior art, the output current is based upon current difference with respect to the feedback loops. Consequently, due to the use of the differential pairs the first output circuit current flow will be the negative of the current flow in the first feedback loop and the second output circuit current flow will be the negative of the current flow in the second feedback loop, thereby improving transfer linearity and bandwidth compared to the prior art.

For the purposes of this embodiment the current generated by the current sources are arranged to have the following multiples:

Third current source=2×Seventh current source; First current source=Second current source+Seventh current source; Sixth current source=2×Eighth current source Fourth current source=Fifth current source+Eighth current source.

By way of illustration, when the input voltage difference is zero (i.e. $V_{in1}-V_{in2}$ 0) no current will flow through the resistor 205 and consequently the current that flows through the first N-type FET 209 and the third N-type FET 215 is identical to the current flow in the output circuits and consequently there will be no output current.

When the input voltage difference is positive (i.e. $V_{in1}-V_{in2}>0$) a current (i.e. $(V_{in1}-V_{in2})/R$) will flow into the resistor 205 and add to the current in the third N-type FET 215.

To compensate for the increase in current flow in the third N-type FET 215 an opposite current flow flows in the fourth N-type FET 216 (i.e. the other half of the second differential pair) to provide an output current $I_{out2}$ in the second output circuit 204 that is equal to $-((V_{in1}-V_{in2})/R)$. Accordingly, the output current $I_{out2}$ in the second output circuit 204 is equal to $-((V_{in1}-V_{in2})/R)$.

Correspondingly, when the output current in the second output circuit 204 is equal to $-((V_{in1}-V_{in2})/R)$ the current flowing into the first N-type FET 209 is reduced by $(V_{in1}-V_{in2})/R$ and this reduced current causes an opposite current flow to flow in the second N-type FET 210 (i.e. the other half of the first differential pair) that is equal to $(V_{in1}-V_{in2})/R$.

Accordingly, the output current $I_{out1}$ in the first output circuit 203 is equal to $(V_{in1}-V_{in2})/R$.

As the output current from the first output circuit 203 equals the negative of the second output circuit 204 the transconductance of the transconductance amplifier 200 is given by 1/R.

Figure 3:
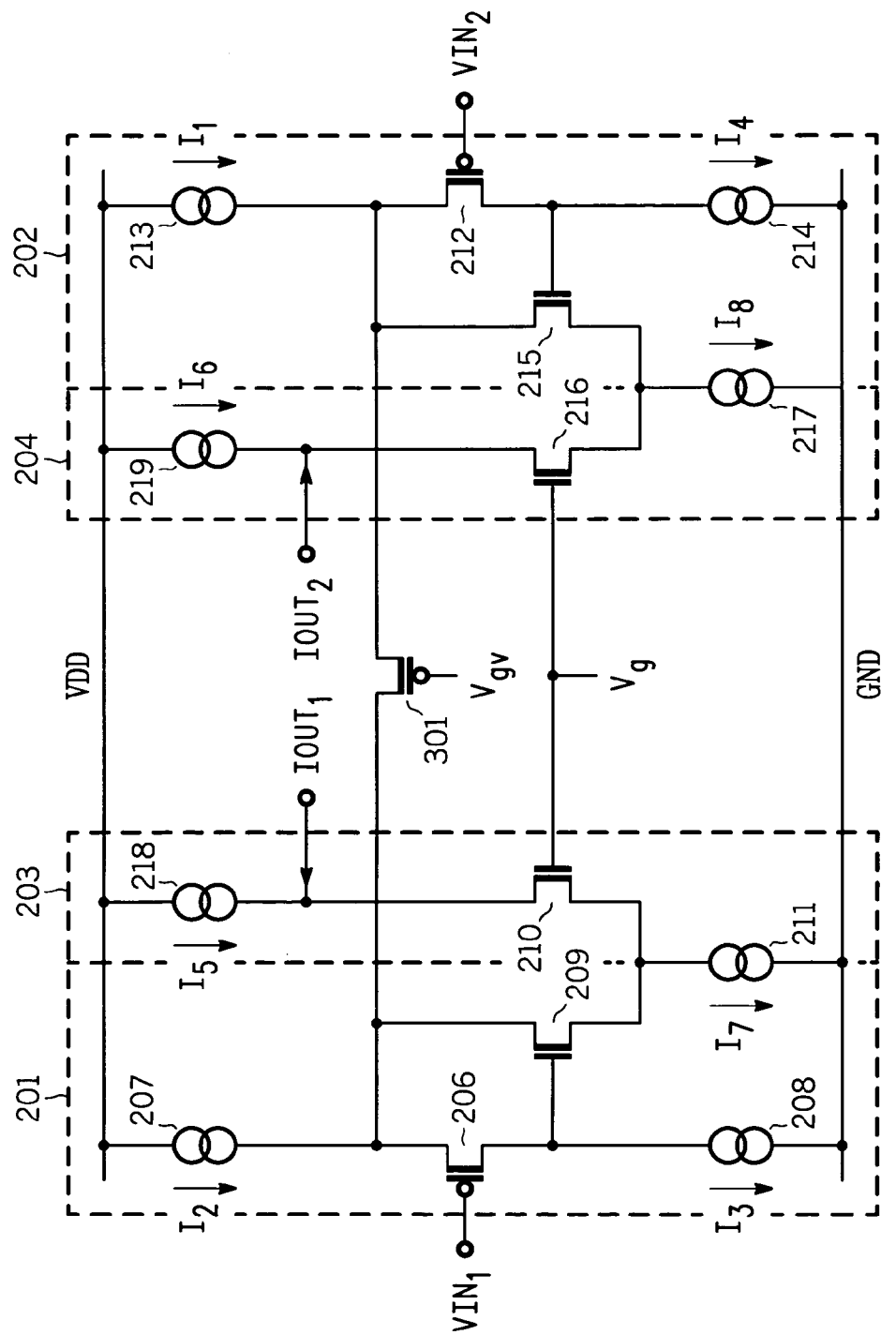
FIG. 3 illustrates a transconductance according to a second embodiment of the present invention.

FIG. 3 shows a second embodiment of a transconductance amplifier 300 having a variable transconductance value.

Figure 1:
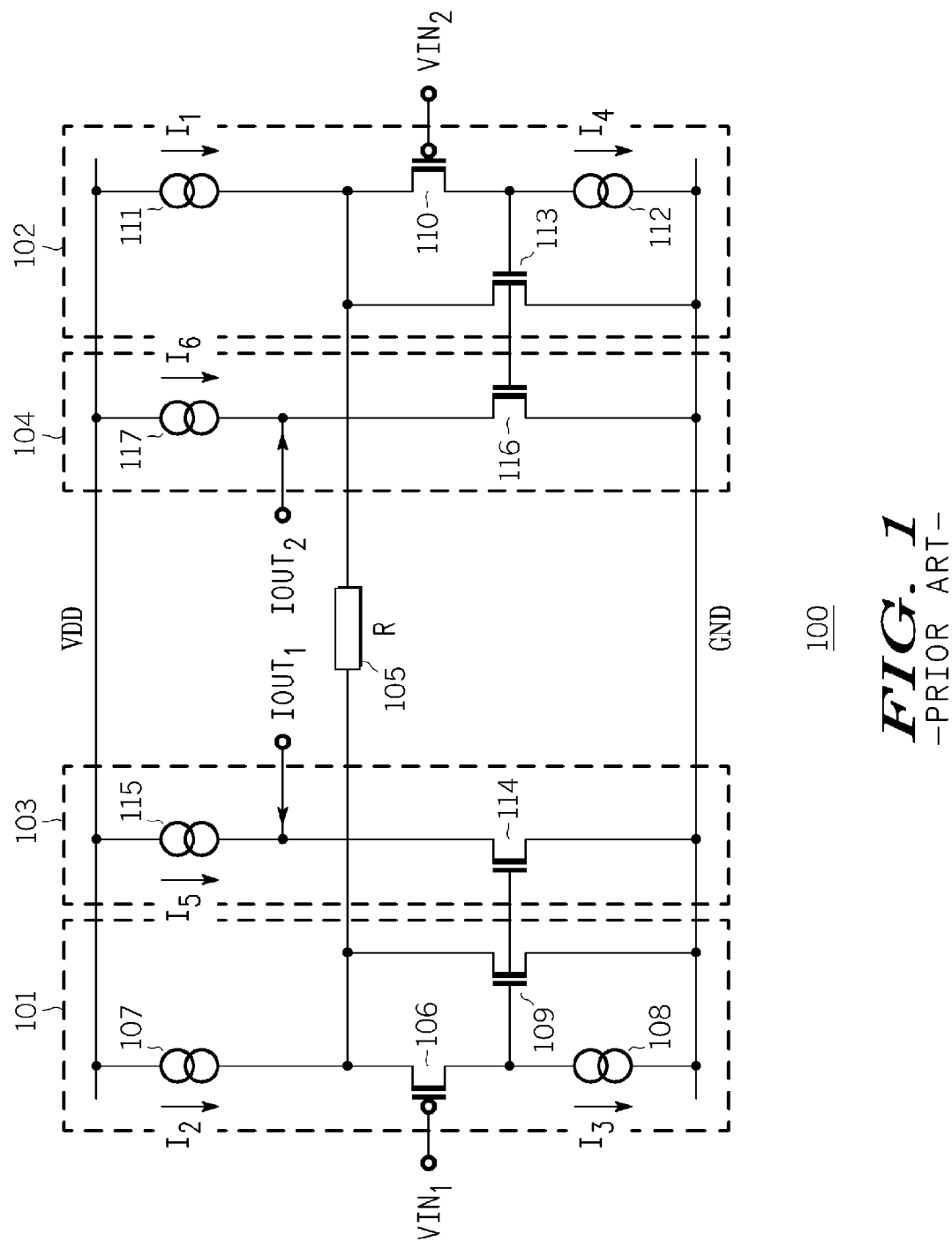
FIG. 1 illustrates a prior art transconductance amplifier.

The transconductance amplifier 300 includes a first input circuit 201, a second input circuit 202, a first output circuit 203 and a second output circuit 204, which are the same as those shown in FIG. 2 and described above. The same reference numerals used in FIG. 3 as those in FIG. 1 represent the same features.

The first input circuit 201 and the second input circuit 202 are coupled via a variable resistor 301 where the variable resistor 301 has a control input $V_{gv}$. For the purpose of this embodiment the variable resistor is a P-type FET, however, other forms of variable resistor can be used. The source and drain of the P-type FET act as the resistors first interface and second interface respectively. The gate of the P-type FET acts as the input for the control input $V_{gv}$, wherein the resistance of the variable resistor is varied via a control voltage applied to the P-type FET gate.

As described above, the transconductance of the transconductance amplifier 300 shown in FIG. 3 corresponds to the inverse of the resistance of the resistor 301. Accordingly, by varying the value of the resistance, via the control voltage $V_{gv}$ applied to the P-type FET gate, the transconductance of the transconductance amplifier 300 can be varied.

Figure 4:
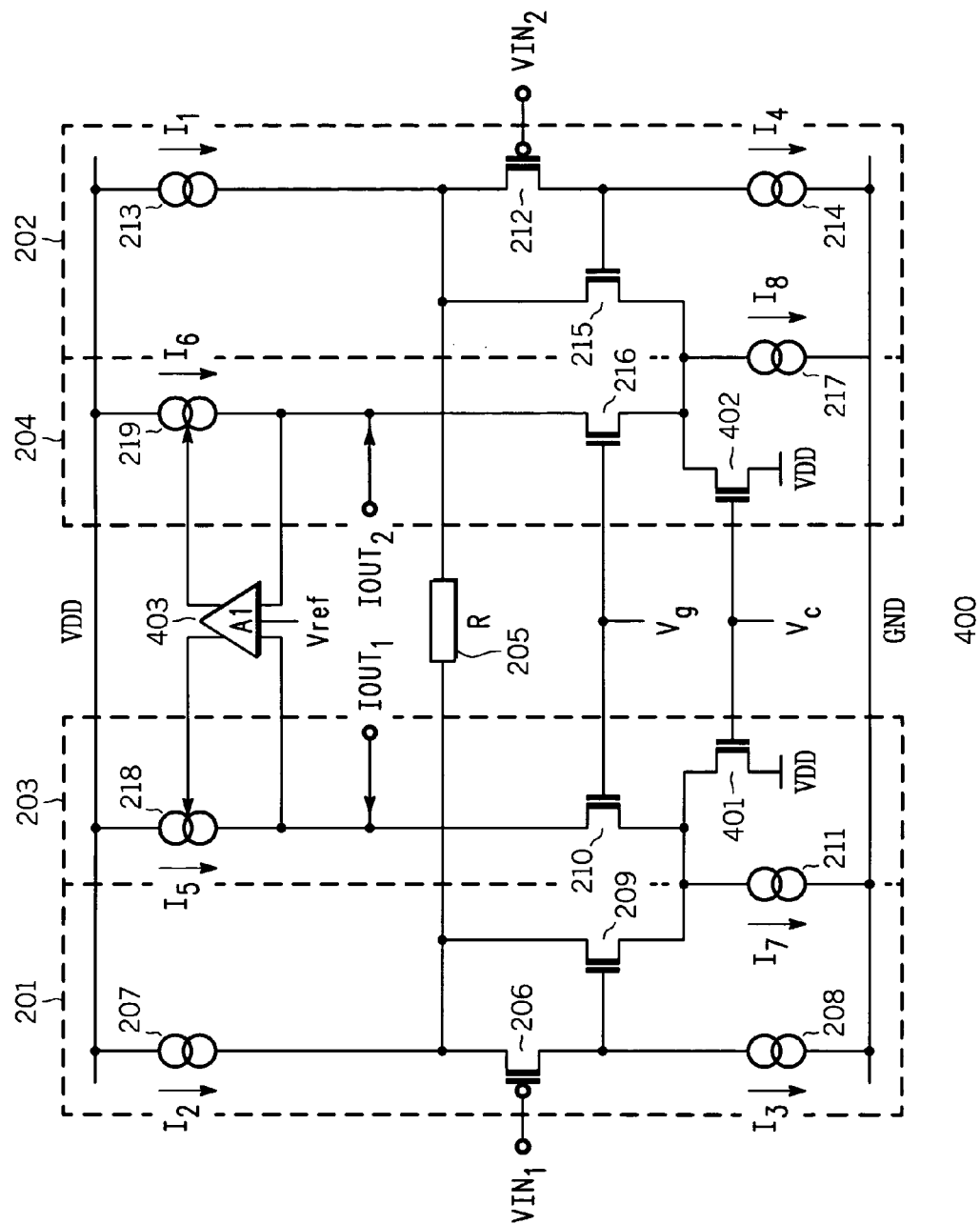
FIG. 4 illustrates a transconductance according to a third embodiment of the present invention.

FIG. 4 shows a third embodiment of a transconductance amplifier 400 having a variable transconductance value.

As with FIG. 2 and FIG. 3 the transconductance amplifier 400 includes a first input circuit 201, a second input circuit 202, a first output circuit 203 and a second output circuit 204, which are the same as shown in FIGS. 2 and 3 and described above where the same reference numerals used in FIG. 4 as those in FIGS. 2 and 3 represent the same features.

As shown in FIG. 4 the source of a fifth N-type FET 401 is coupled to the source of the first N-type FET 209 and the second N-type FET 210, which form the first differential pair, and the source of a sixth N-type FET 402 is coupled to the source of the third N-type FET 215 and the fourth N-type FET 216, which form the second differential pair. The drains of the fifth N-type FET 401 and the sixth N-type FET 402 are coupled to the supply line $V_{DD}$. The gates of the fifth N-type FET 401 and the sixth N-type FET 402 are both coupled to a control voltage $V_c$.

Accordingly, the first N-type FET 209, the second N-type FET 210 and the fifth N-type FET 401 form a first differential pair and the third N-type FET 215, the fourth N-type FET 216 and the seventh N-type FET 402 form a second differential pair.

Additionally, a common mode loop 403 is coupled to the seventh current source 218 and eighth current source 219. In this embodiment the common mode loop 403 is an amplifier that corrects the current flow in the seventh current source 218 and the eighth current source 219 if the output common mode voltage moves away from an input reference voltage Vref.

The transconductance amplifier 400 shown in FIG. 4 operates in a similar matter to the transconductance amplifier 200 shown in FIG. 2, however, by changing the control voltage $V_c$ applied to the gates of the fifth N-type FET 401 and the sixth N-type FET 402 the amount of current that flows in the fifth N-type FET 401 and the sixth N-type FET 402 correspondingly changes, thereby changing the amount of current that flows in the first N-type FET 209, the second N-type FET 210, the third N-type FET 215 and the fourth N-type FET 216.

Accordingly, the higher the control voltage $V_c$ applied to the gates of the fifth N-type FET 401 and the sixth N-type FET 402 the higher the current flow through the fifth N-type FET 401 and the sixth N-type FET 402 and correspondingly the less current flow through the first N-type FET 209, the second N-type FET 210, the third N-type FET 215 and the fourth N-type FET 216, thereby reducing the transconductance of the transconductance amplifier 400.

If the control voltage $V_c$ applied to the gates of the fifth N-type FET 401 and the sixth N-type FET 402 is set low then no current will flow through the fifth N-type FET 401 and the sixth N-type FET 402 and the transconductance amplifier 400 will operate in the same manner as that shown and described in FIG. 2.

A consequence of reducing the transconductance by increasing the control voltage to the gates of the fifth N-type FET 401 and the sixth N-type FET 402 results in a reduction in DC current flow into the second N-type FET 210 and the fourth N-type FET 216. Accordingly, the common mode loop 403 is used to maintain the current flow from the seventh current source 218 equal to the DC current in the second N-type FET 210 and correspondingly the current flow from the eighth current source 219 equal to the DC current in the fourth N-type FET 216.

We claim:

1. A transconductance amplifier comprising:
   a first input circuit having a first feedback loop;
   a second input circuit having a second feedback loop;
   a resistor having a first interface connected to the first input circuit and a second interface connected to the second input circuit;
   a first differential pair having a first transistor arranged to control current flow in the first feedback loop to maintain a voltage at the first interface of the resistor at substantially a constant voltage relative to an input voltage applied to the first input circuit;
   a second transistor arranged to control current flow for a first output and a fifth transistor; and
   a second differential pair having a third transistor arranged to control current flow in the second feedback loop to maintain a voltage at the second interface of the resistor at substantially a constant voltage relative to an input voltage applied to the second input circuit,
   a fourth transistor arranged to control current flow for a second output and a sixth transistor, wherein the fifth transistor and sixth transistor are arranged to be coupled to a control signal for varying the current flow for the first output and the current flow for the second output respectively.

2. A transconductance amplifier according to claim 1, wherein the transconductance is the inverse of the resistance of the resistor.

3. A transconductance amplifier according to claim 1, wherein the resistor is a fixed resistor.

4. A transconductance amplifier according to claim 1, wherein the resistor is a variable resistor to allow the transconductance of the transconductance amplifier to be varied.

5. A transconductance amplifier according to claim 1, further comprising a common-mode loop arranged to maintain an output current substantially equal to zero when the voltage difference between the input voltage applied to the first input circuit and the input voltage applied to the second input circuit is substantially zero.

* * * * *